United States Patent
Dashtestani et al.

(10) Patent No.: US 10,454,360 B1
(45) Date of Patent: Oct. 22, 2019

(54) CHARGE PUMP OVERSHOOT PREVENTION FOR GATE DRIVERS

(71) Applicant: NXP USA, Inc., Austin, TX (US)

(72) Inventors: Ahmad Dashtestani, Scottsdale, AZ (US); Siamak Delshadpour, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/192,410

(22) Filed: Nov. 15, 2018

(51) Int. Cl.
*H02M 1/32* (2007.01)
*H02M 3/07* (2006.01)

(52) U.S. Cl.
CPC ............... *H02M 1/32* (2013.01); *H02M 3/07* (2013.01)

(58) Field of Classification Search
CPC .................................. H02M 1/32; H02M 3/07
See application file for complete search history.

(56) References Cited

U.S. PATENT DOCUMENTS

| | | | | |
|---|---|---|---|---|
| 6,404,252 B1* | 6/2002 | Wilsch | ............ | G05F 3/205 323/312 |
| 8,169,252 B2* | 5/2012 | Fahrenbruch | ..... | H01L 31/02021 136/244 |
| 8,618,864 B2* | 12/2013 | Robbins | ............ | H01L 31/02021 327/427 |
| 9,106,228 B2* | 8/2015 | Genest | .................. | H03K 17/162 |
| 9,584,115 B2* | 2/2017 | Vogt | ...................... | H03K 17/687 |
| 2009/0184753 A1 | 7/2009 | Kawashima et al. | | |
| 2011/0148509 A1 | 6/2011 | Pan | | |
| 2011/0163796 A1* | 7/2011 | Floyd | ............... | H03K 17/08122 327/536 |

* cited by examiner

*Primary Examiner* — Dinh T Le

(57) ABSTRACT

An over-voltage protection circuit and method may include a pass gate and a voltage boosting circuit for providing protection to start-up voltage-sensitive circuits during start-up conditions of a system including the voltage-sensitive circuits. The pass gate may include a drain, source, and gate, with the drain configured to receive an input signal and the source configured to output the input signal, in response to a pass gate driving voltage signal applied to the gate of the pass gate. The voltage boosting circuit may include an output coupled to the gate of the pass gate, the voltage boosting circuit configured to generate a pass gate driving voltage on the output. The voltage boosting circuit further configured to passively control the pass gate driving voltage to a level less than a steady-state voltage level during start-up of the protection circuit.

15 Claims, 9 Drawing Sheets

CHARGE PUMP OVERSHOOT PREVENTION FOR GATE DRIVERS

TECHNICAL FIELD

Embodiments disclosed herein relate generally to over-voltage protection of over-voltage sensitive electronic circuits.

BACKGROUND OF THE DISCLOSURE

During steady-state operation, most electronic circuits operate within the specifications of the various individual components. However, during transient operating conditions, such as during start-up, some components or circuits may generate transient signals that may exceed the specifications of other components, thereby subjecting the other components to potentially damaging conditions. Accordingly, sensitive components may require additional protection during vulnerable transitory conditions.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

It should be understood that the figures are merely schematic and are not drawn to scale. It should also be understood that the same reference numerals may be used throughout the figures to indicate the same or similar parts.

DETAILED DESCRIPTION

Figure 1:
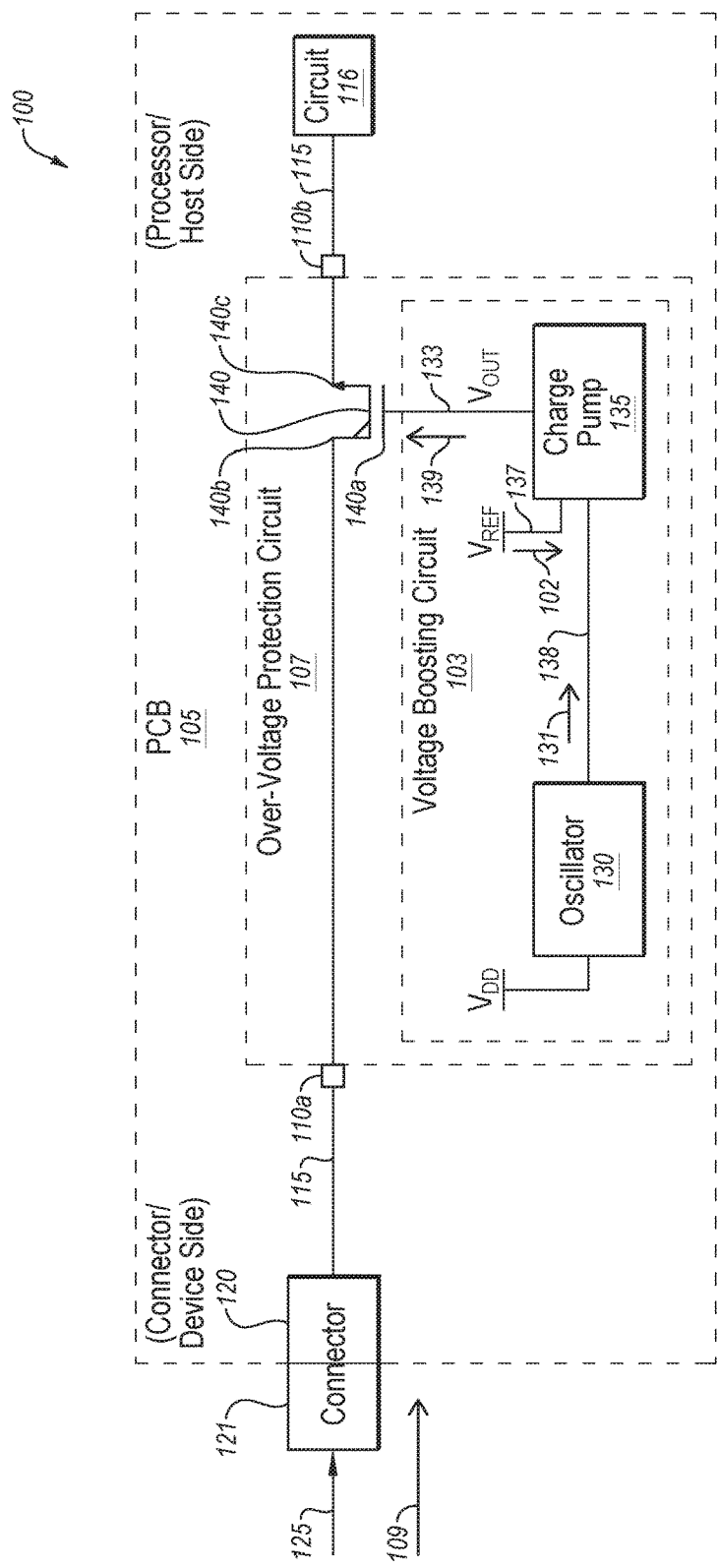
FIG. 1 illustrates an interconnection system for a circuit on a printed circuit board (PCB), in accordance with embodiments described herein.

According to the various embodiments, an over-voltage protection circuit for protecting over-voltage-sensitive circuits during a start-up phase of the system is disclosed. The over-voltage protection circuit suppresses start-up transients that could potentially damage the over-voltage sensitive circuit. Embodiments described herein address overshoot by a voltage output signal (i.e., gate driving signal) of a voltage boosting circuit during start-up. The embodiments include an over-voltage protection circuit for protecting an input circuit from high voltage surges. The over-voltage protection circuit includes a voltage boosting circuit and a pass gate. The voltage boosting circuit may include an oscillator and a charge pump. The oscillator may be configured, for example, as a ring oscillator and the charge pump may be configured, for example, as a Dickson charge pump. The voltage boosting circuit described herein may drive a pass gate and may be configured to avoid overshooting a designated output voltage during the powering-up of a system.

The pass gate may include a drain, source, and gate, with the drain configured to receive an input signal and the source configured to output the input signal, in response to a pass gate driving voltage signal applied to the gate of the pass gate. The voltage boosting circuit may include an output coupled to the gate of the pass gate, the voltage boosting circuit configured to generate a pass gate driving voltage on the output. The pass gate driving voltage may be passively controlled during start-up of the protection circuit to a level less than a steady-state voltage level.

In operation, most electronic integrated circuits work with the proper input voltages as specified by the capabilities of the transistors and the other components. However, during circuit start-up conditions, various transistors and other components designed to protect other circuits from transients, may be ineffective. Further, some circuits during start-up conditions may even create detrimental signals and signal levels which exacerbate transient conditions. In some applications, such as, for example, USB drivers and receivers, higher voltages beyond the tolerance of the transistors and other components may arrive at the inputs of the integrated circuit.

To avoid extreme damage to the chip, the pins that could see high voltages may be blocked by one or more special transistors, as for example in pass transistors that tolerate higher input voltages. These transistors may require circuits to control the gates of the transistors. As disclosed in the embodiments herein, an internal regulated voltage may be multiplied a few times by circuits called charge pumps to achieve a high voltage to drive the gates of these high-voltage blocker transistors.

Conventionally, the charge pumps may be designed for open-loop performance to reduce complexity and die area on an integrated circuit. Operating in open loop may cause overshoots (although overshoots are not limited to open loops) during an initial ramp-up of the boosted voltage during start-up operations. The overshoot may cause damage to the transistors.

As described herein, an over-voltage protection circuit may include a pass gate and a voltage boosting circuit for providing protection to start-up voltage-sensitive circuits during start-up conditions of a system that incorporates high-voltage sensitive circuits. The pass gate may include a drain, source, and gate, with the drain configured to receive an input signal and the source configured to output the input signal, in response to a pass gate driving voltage signal applied to the gate of the pass gate.

The voltage boosting circuit may include an output coupled to the gate of the pass gate, the voltage boosting circuit configured to generate a pass gate driving voltage on the output. The pass gate driving voltage may be passively controlled during start-up of the protection circuit to a level less than a steady-state voltage level. In some embodiments, the voltage boosting circuit may include an oscillator and a charge pump.

The oscillator may also include a ring oscillator and a current mirror of transistors configured to supply bias current to the ring oscillator. The charge pump may be configured to generate the levels of the pass gate driving voltage in response to control by the oscillator.

In some embodiments, the oscillator may include a start-up oscillator bias control circuit configured to reduce a frequency of the oscillator to a level less than a steady-state level during start-up of the protection circuit. The start-up oscillator bias control circuit may also be configured to reduce the bias current to the oscillator during start-up of the protection circuit. The start-up oscillator bias control circuit may be configured to reduce a frequency of the oscillator to a level less than a steady-state level during start-up of the protection circuit. Further, the start-up oscillator bias control circuit may be configured to reduce the bias current to the ring oscillator during start-up of the protection circuit. Yet further the start-up oscillator bias control circuit may be configured to provide low-pass filtering of gates of the transistors in the current mirror.

As described herein, an interconnection system may include a first printed circuit board (PCB) node coupled to an external interface and a second PCB node coupled to an electronic circuit. The system may further include an over-voltage protection circuit coupled between the first PCB node and the second PCB node. The over-voltage protection circuit may include a pass gate including a drain configured to receive an input signal, a source configured to output the input signal, and a gate configured to control passing of the input signal between the drain and the source. The over-voltage protection circuit may further include a voltage boosting circuit including an output coupled to the gate of the pass gate. The voltage boosting circuit may be configured to generate a pass gate driving voltage on the output, wherein the pass gate driving voltage may be passively controlled during start-up of the protection circuit to a level less than a steady-state voltage level.

As further described herein, a method of protecting a voltage level sensitive circuit is described. The method includes generating bias currents to a ring oscillator of the over-voltage protection circuit, wherein the level of the bias current is less than a steady-state level during start-up of the over-voltage protection circuit. The method further includes generating an oscillator signal at an output of the ring oscillator, wherein the oscillator signal has a frequency based on the level of the bias current. A reference voltage is boosted to a pass gate driving voltage to control a gate of the pass gate of a pass transistor of the over-voltage protection circuit. The gate of the pass transistor is then driven with the pass gate driving voltage.

The method may further include passively reducing a bias current to a ring oscillator of an over-voltage protection circuit during start-up of the ring oscillator and increasing the bias current to the ring oscillator during steady-state of the ring oscillator. The method may further include low-pass filtering a supply voltage at gates of a current mirror outputting the bias current to the ring oscillator during start-up of the ring oscillator. Further, the low-pass filter may include a capacitor coupled between the gates of the current mirror and a supply line providing the supply voltage.

FIG. 1 illustrates an interconnection system 100 of a printed circuit board (PCB) 105 in accordance with embodiments described herein. The PCB 105 may be connected through a node 110a on a connector/device side through a PCB line 115 to an external interface such as a connector 120. The connector 120 may be a USB Type-C connector or the like. The PCB 105 may be connected through a second node 110b on a processor/host side through the PCB line 115 to electronic circuit 116, such as a host. The host side may include a processor or other load. The connector 120 may receive an opposing connector 121 attached to a cable 125 or other device.

The PCB 105 may include an over-voltage protection circuit 107 configured to block an over-voltage input signal 109 when an over-voltage or surge condition at the node 110a occurs during start-up of the over-voltage protection circuit 107. Accordingly, the over-voltage input signal 109 is desirably blocked by the pass gate 140 between node 110a and node 110b during start-up of the over-voltage protection circuit 107. In one embodiment, the nodes 110a and 110b may be discrete interconnection nodes such as for connection between discrete subassemblies. In another embodiment, the nodes 110a and 110b may be illustrative of interconnection points within the electronic circuit 116 on the PCB 105. Furthermore, in one embodiment, the over-voltage protection circuit 107 is directly coupled to the connector 120 for providing over-voltage and surge protection against any over-voltage input signal 109 presented at the connector 120. However, in another embodiment, the over-voltage protection circuit 107 may be embedded within electronic circuit 116 on the PCB 105 and may indirectly couple with the connector 120.

The over-voltage protection circuit 107 includes a voltage boosting circuit 103 and a pass gate 140. The voltage boosting circuit 103 includes an oscillator 130 and a charge pump 135. The voltage boosting circuit 103 couples to a pass gate 140. The oscillator 130 provides an oscillator signal 131 on output 138 which in turn controls the switching within the charge pump 135 for boosting a reference voltage $V_{REF}$ 102 at the charge pump input 137. The charge pump 135 generates a pass gate driving voltage $V_{OUT}$ 139 by boosting the reference voltage $V_{REF}$ 102 at the charge pump input 137. The pass gate driving voltage 139 on charge pump output 133 in turn drives a gate 140a of the pass gate 140 allowing an input signal, such as the over-voltage input signal 109, to pass between a drain 140b and a source 140c of the pass gate 140.

Figure 2:
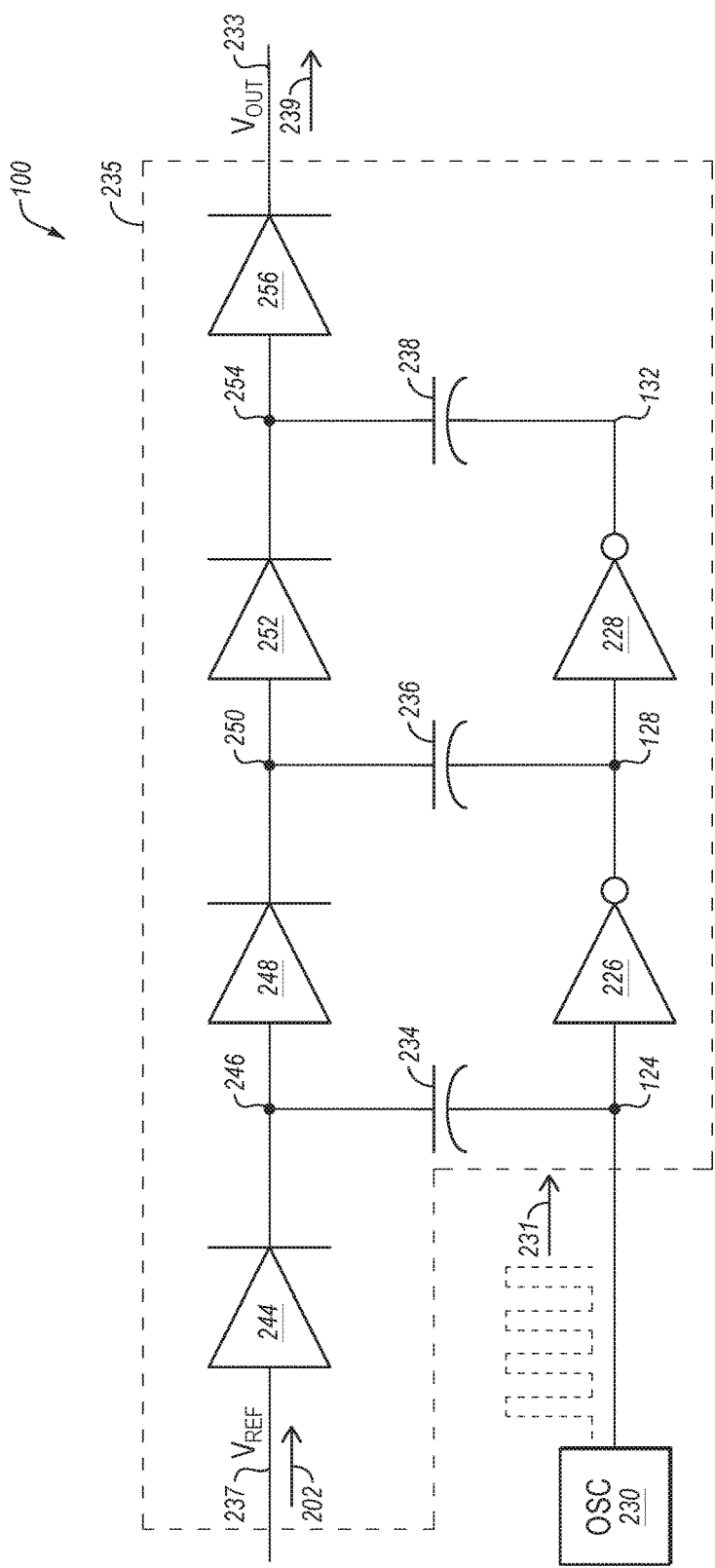
FIG. 2 illustrates a circuit diagram of an oscillator and a charge pump of an over-voltage protection circuit, in accordance with embodiments described herein.

FIG. 2 illustrates a charge pump 235 for boosting a voltage, for example, by one or more multiples. In one embodiment, a regulated voltage, such as reference voltage $V_{REF}$ 202 may be boosted using an open loop charge pump 235. The charge pump 235 includes a charge pump input 237 for receiving the reference voltage $V_{REF}$ 202 and a pass gate driving voltage $V_{OUT}$ 239 on charge pump output 233 for outputting a boosted output voltage $V_{OUT}$.

The reference voltage $V_{REF}$ 202 at the charge pump input 237 ripples through a plurality of series-coupled diodes, for example diodes 244, 248, 252, 256, with some of the diodes experiencing alternating forward and reverse biasing. The biasing of the diodes is controlled by an oscillator 230 that generates an oscillating waveform 231. The rippling of the input signal (starting out as the reference voltage $V_{REF}$ 202) through the series of diodes occurs by coupling the oscillating waveform 231 to series-coupled inverters, for example inverters 226, 228. These series-coupled inverters 226, 228 are further coupled to capacitors, for example capacitors 234, 236, 238, that are further coupled to the diodes 244, 248, 252, 256 in a shunt configuration, as illustrated in FIG. 2.

In operation, the diodes 244, 248, 252, 256 conduct the current on the charge pump input 237 in one direction. When a specific diode is forward biased, the diode charges the capacitor connected to its output using charge present on the input of the forward biased diode. A diode becomes forward biased when its output is at a voltage level that is a "diode drop" (about 0.5 V-0.7 V) less than the input voltage present at the diode input. Further, the ends of the capacitors 234, 236, 238 coupled to the series-coupled inverters 226, 228 receive the oscillating voltage levels of the oscillator waveform 231. Accordingly, the voltages present at the inputs and outputs of the diodes 244, 248, 252, 256 oscillate with the oscillations of the oscillator waveform 231 via the respective voltages across capacitors 234, 236, 238.

The charge pump 235 pumps or ripples the charge stored on one capacitor coupled to the input of a diode, through the diode when the other end of the capacitor is raised to a higher voltage from the oscillator waveform. More specifically, every time the bottom plate of a capacitor (i.e., the plate coupled to the series-coupled inverters propagating the oscillator waveform) is raised suddenly, as in when the oscillator waveform increases the voltage on the bottom plate, the top plate of the capacitor (i.e., the plate coupled to the series-coupled diodes) also observes the same increase in voltage resulting in a voltage at the input of a diode that is the sum of both the voltage stored in the capacitor plus the voltage of the oscillator waveform at the bottom plate of the capacitor. Accordingly, by adding more successive stages, multiple voltages of the input voltage may be generated.

Figure 3:
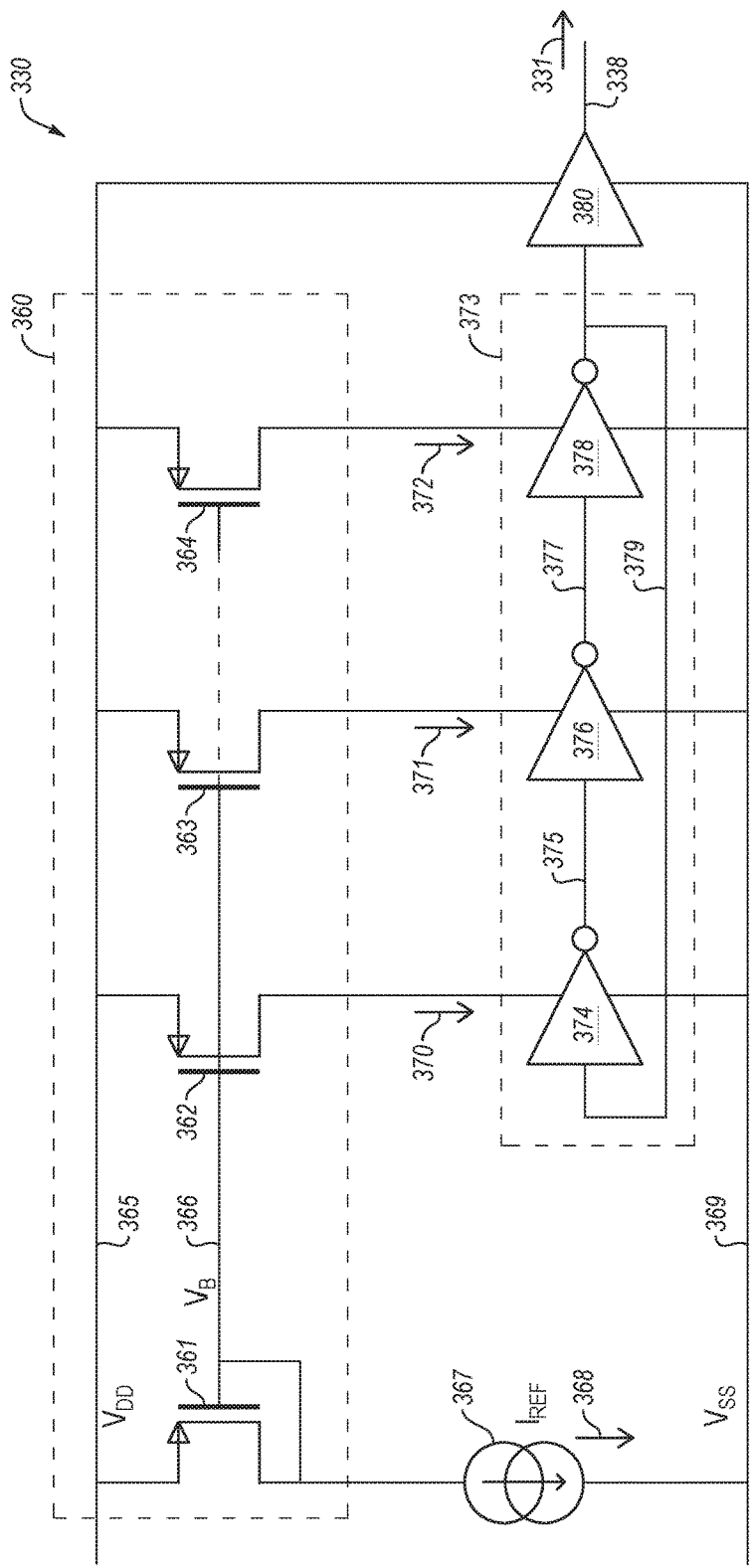
FIG. 3 illustrates a circuit diagram of an oscillator, in accordance with embodiments described herein.

FIG. 3 is a block diagram of an oscillator 330 configured as a current controlled oscillator and is provided herein for illustration of the operation of, for example, a ring oscillator. The oscillator 330 forms the basis for oscillator 530 of FIG. 5 which provides improved performance for the over-voltage protection circuit 107, in accordance with the embodiments disclosed herein. The oscillator 330 may be similar to oscillator 130 of FIG. 1 and oscillator 230 of FIG. 2. The oscillator 330 may include a current mirror 360 including a transistor 361 and one or more additional transistors 362, 363, 364 with respective sources coupled to a common source line 365 for providing a source voltage $V_{DD}$, and respective gates coupled to a common control line 366 which is further coupled to the drain of transistor 361.

The oscillator 330 further includes a constant current source 367 configured to source a reference current $I_{REF}$ 368 to a common reference line 369, which when operational exhibits a reference voltage of $V_{SS}$. Because of the current mirror configuration, each of the transistors 362, 363, 364 are configured to source respective bias currents 370, 371, 372 proportional to the reference current $I_{REF}$ 368 according to the proportional sizes of respective transistors 362, 363, 364. The common control line 366 responds to a bias voltage $V_B$ which in turn causes the respective transistors 362, 363, 364 to be respectively driven in order to generate the bias currents 370, 371, 372 for each of inverters 374, 376, 378.

The oscillator 330 further includes a ring oscillator 373 configured to include an odd number quantity of inverters, illustrated herein as inverters 374, 376, 378. In operation, the inverter 374 receives bias current 370 from transistor 362 and also couples to common reference line 369. The inverter 374 further includes an output coupled to an input of inverter 376 via line 375. The inverter 376 receives bias current 371 from transistor 363 and also couples to common reference line 369. The inverter 376 further includes an output coupled to an input of inverter 378 via line 377. The inverter 378 receives bias current 372 from transistor 364 and also couples to common reference line 369. The inverter 378 further includes an output coupled to an input of inverter 374 via line 379. The oscillator 330 further includes an output buffer 380 coupled between line 379 and oscillator output 338 for passing the oscillator waveform 331.

With reference again to the system of FIG. 1, since a charge pump 135 provides a high voltage drive signal (the pass gate driving voltage 139) for the gate of a protection transistor (the pass transistor 140), the charge pump must function with reference currents and voltages that may be transient and still in the process of settling to steady-state levels. Therefore, most oscillators that are configured as current control oscillators experience the same transient and non-steady-state currents and voltages which may create unpredictable or undesirable circuit behavior.

Figure 4A:
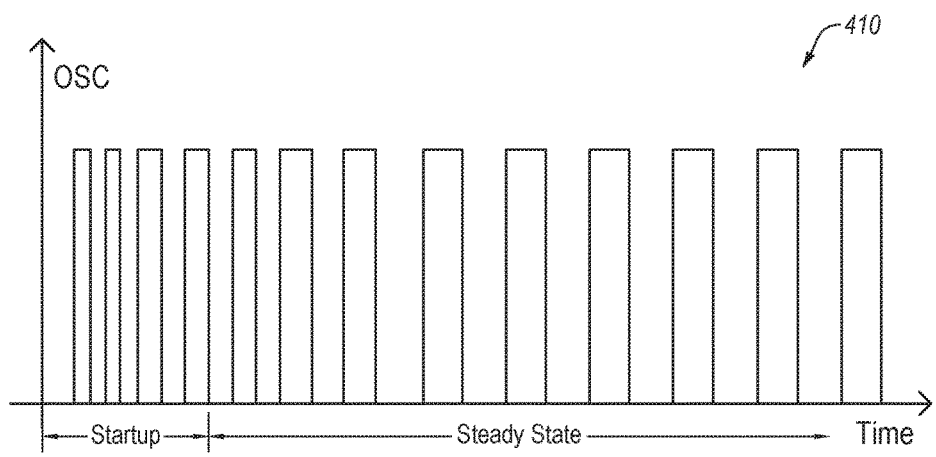
FIGS. 4A and 4B illustrate plots of oscillator start-up conditions with respect to signal frequencies and signal levels, in accordance with embodiments described herein.
Figure 4B:
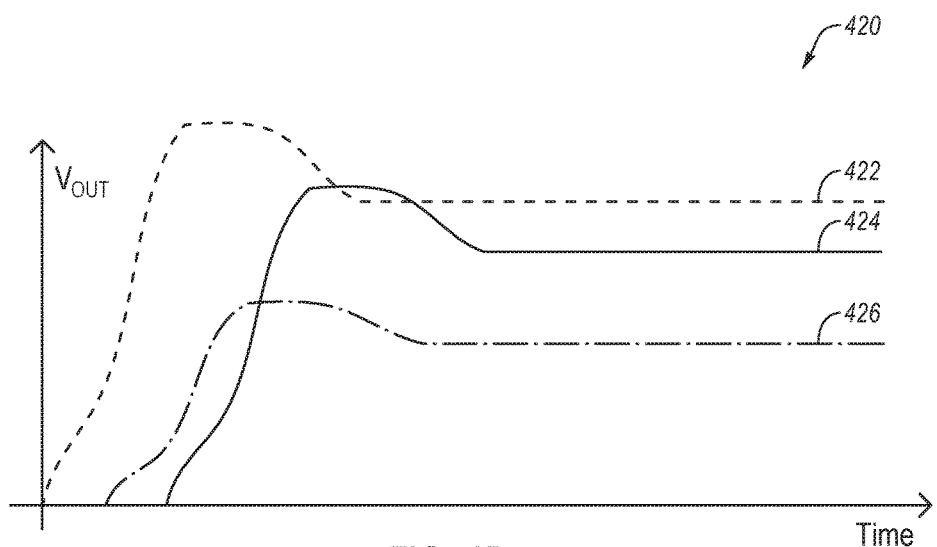

FIGS. 4A and 4B illustrate plots of oscillator start-up conditions with respect to signal frequencies and signal levels. In plot 410, the oscillator 330 of FIG. 3 may be current starved and therefore unable to control the oscillation frequency. Accordingly, the frequency at initial start-up may be very high with respect to the frequency as steady-state conditions appear. Further, the oscillator 330 on start-up may also exhibit larger currents with larger magnitudes. At start-up, the reference current $I_{REF}$ 368 quickly increases in magnitude causing an increase in the frequency of the oscillator. Such an increase in frequency and then stabilizing at a steady-state frequency is illustrated in plot 410.

A plot 420 illustrates various signal levels as a function of time. As noted in a waveform 422, the bias current $I_B$ through each of the inverters 374, 376, 378 overshoots the steady-state level which in turn causes the transconductance gm, shown in waveform 426, of the inverters 374, 376, 378 to overshoot, resulting in the pass gate driving voltage $V_{OUT}$ 139, 239 on charge pump output 133, 233, shown in waveform 424 to also avoid overshooting the steady-state levels.

The overshoot of the pass gate driving voltage $V_{OUT}$ 139, 239 may result in overdriving the pass gate 140 of FIG. 1. When the pass gate 140 is overdriven, then an over-voltage input signal 109 may be passed through to the over-voltage sensitive circuit that may be susceptible to damage. The overshoot during start-up is not only undesirable, but also may affect the reliability of the circuit since excessive voltage may cause serious damage and degradation to the electronic circuits and the packaged circuit as well.

Figure 5:
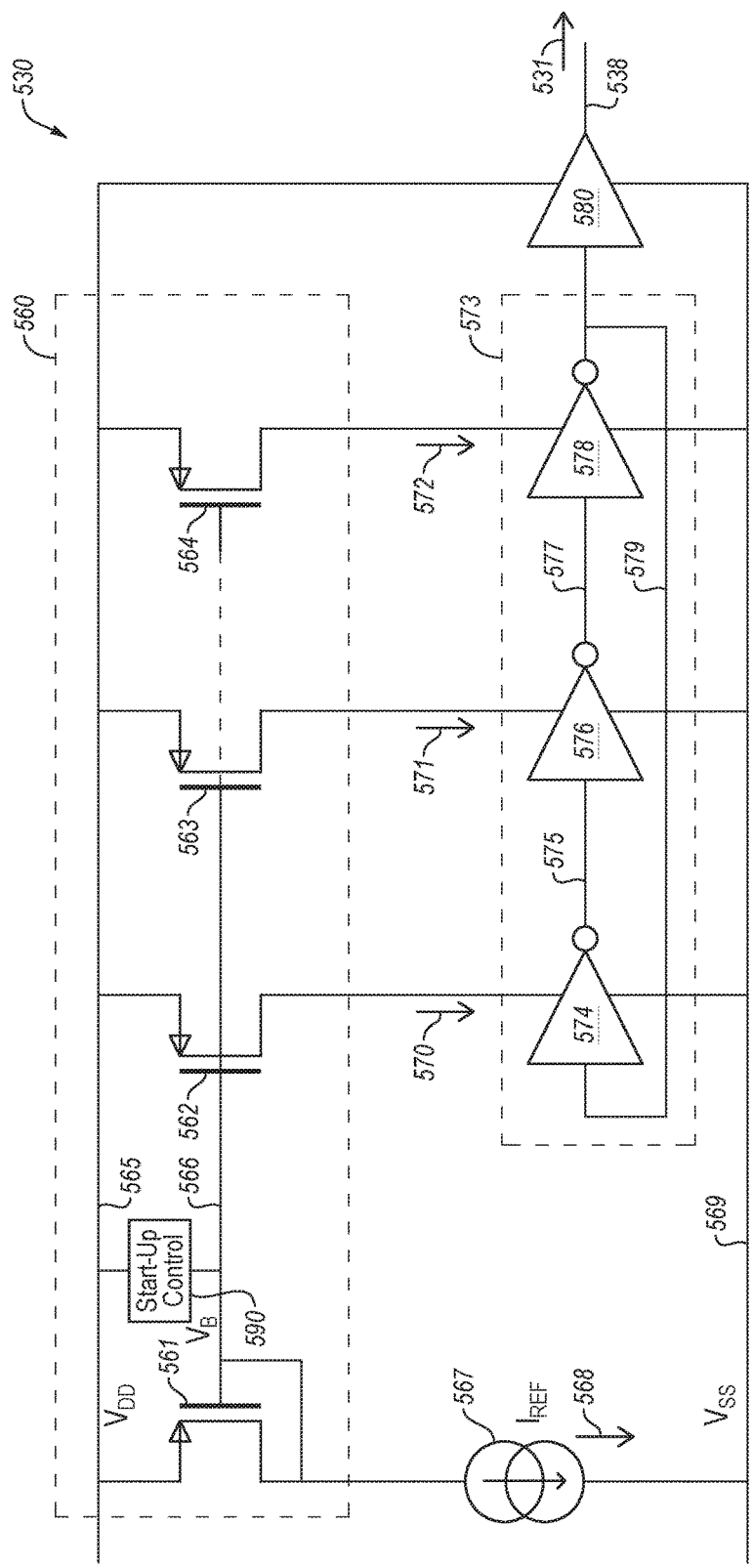
FIG. 5 illustrates a circuit diagram of an oscillator, in accordance with another embodiment described herein.

FIG. 5 illustrates an oscillator 530 configured as a current controlled oscillator, in accordance with an embodiment. The oscillator 530 provides control for the generation of the bias current to the ring oscillator. Such control of the bias current results in a reduction of overshoot of the bias current which results in a reduction of the overshoot in the output voltage $V_{OUT}$ of the charge pump during start-up of the system.

The oscillator 530 may be similar to oscillator 130 of FIG. 1 and oscillator 230 of FIG. 2. The oscillator 530 may include a current mirror 560 including a transistor 561 and one or more additional transistors 562, 563, 564 with respective sources coupled to a common source line 565 for providing a source voltage $V_{DD}$, and respective gates coupled to a common control line 566 which is further coupled to the drain of transistor 561.

The oscillator 530 further includes a constant current source 567 configured to source a reference current $I_{REF}$ 568 to a common reference line 569, which when operational exhibits a reference voltage of $V_{SS}$. Because of the current mirror configuration, each of the transistors 562, 563, 564 are configured to source respective bias currents 570, 571, 572 proportional to the reference current $I_{REF}$ 568 according to the proportional sizes of respective transistors 562, 563, 564. The common control line 566 responds to a bias voltage $V_B$ which in turn causes the respective transistors 562, 563,

564 to be respectively driven in order to generate the bias currents 570, 571, 572 for each of inverters 574, 576, 578.

The oscillator 530 further includes a ring oscillator 573 configured to include an odd number quantity of inverters, illustrated herein as inverters 574, 576, 578. In operation, the inverter 574 receives bias current 570 from transistor 562 and also couples to common reference line 569. The inverter 574 further includes an output coupled to an input of inverter 576 via line 575. The inverter 576 receives bias current 571 from transistor 563 and also couples to common reference line 569. The inverter 576 further includes an output coupled to an input of inverter 578 via line 577. The inverter 578 receives bias current 572 from transistor 564 and also couples to common reference line 569. The inverter 578 further includes an output coupled to an input of inverter 574 via line 579. The oscillator 530 further includes an output buffer 580 coupled between line 579 and oscillator output 538 for passing an oscillator signal 531.

In accordance with the various embodiments and in response to the foregoing shortcomings, the oscillator 530 further includes a start-up oscillator bias control circuit 590 configured to control the generation of the bias current 570, 571, 572 to the ring oscillator 573 during start-up or power transient conditions. The start-up oscillator bias control circuit 590 provides low-pass filtering of the common control line 566 coupled to the gates of transistors 561, 562, 563, 564. The start-up oscillator bias control circuit 590 may couple between the common control line 566 and the common source line 565.

In operation, the start-up oscillator bias control circuit 590 reduces voltage spikes of the bias voltage $V_B$ at common control line 566 during power-up or other start-up or transient conditions. By reducing the voltage spikes or overshoots on the bias voltage $V_B$ at common control line 566, any current transients in the bias currents 570, 571, 572 are also reduced.

Figure 6A:
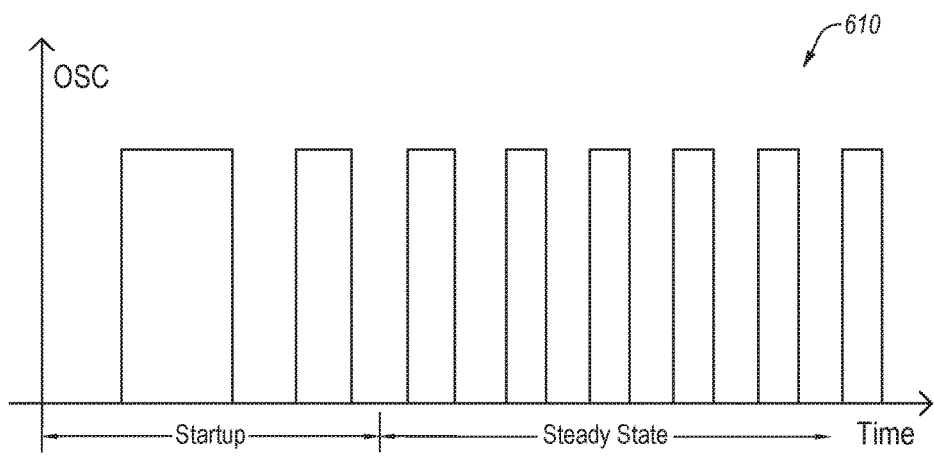
FIGS. 6A and 6B illustrate plots of oscillator start-up conditions with respect to signal frequencies and signal levels, in accordance with embodiments described herein.
Figure 6B:
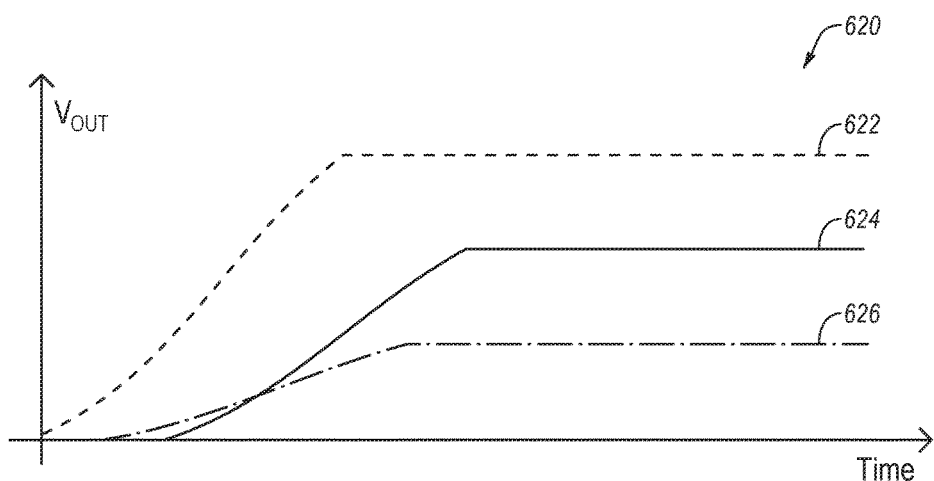

FIGS. 6A and 6B illustrate plots of oscillator start-up conditions with respect to signal frequencies and signal levels. In plot 610, the oscillator 530 of FIG. 5 may be current starved and therefore unable to control the oscillation frequency. However, the start-up oscillator bias control circuit 590 provides a low-pass filtering of the common control line 566 which results in a reduced oscillation frequency at initial start-up with respect to the frequency as steady-state conditions. Further, the oscillator 530 on start-up may also exhibit smaller currents with smaller magnitudes. At start-up, the reference current $I_{REF}$ 568 gradually increases in magnitude causing an increase in the frequency of the oscillator. Such an increase in frequency and then stabilizing at a steady-state frequency is illustrated in plot 610.

A plot 620 illustrates various signal levels as a function of time. As noted in a waveform 622, the bias current $I_B$ through each of the inverters 574, 576, 578 does not overshoot the steady-state level which in turn causes the transconductance gm, shown in waveform 626, of the inverters 574, 576, 578 to avoid overshooting, resulting in the pass gate driving voltage $V_{OUT}$ 139, 239 on charge pump output 133, 233, shown in waveform 624, to also avoid overshooting the steady-state levels.

By avoiding overshoot of the charge pump output voltage $V_{OUT}$ also results in avoiding overdriving the pass gate 140 of FIG. 1. When the pass gate 140 is not overdriven, then an input signal 109 may be passed through to the sensitive electronic circuit that may be susceptible without damage from the interconnection system 100 of FIG. 1. Accordingly, the start-up oscillator bias control circuit 590 prevents overshooting by the bias currents 570, 571, 572 (waveform 622), the charge pump output voltage $V_{OUT}$ (waveform 624), and the transconductance gm (waveform 626).

Figure 7:
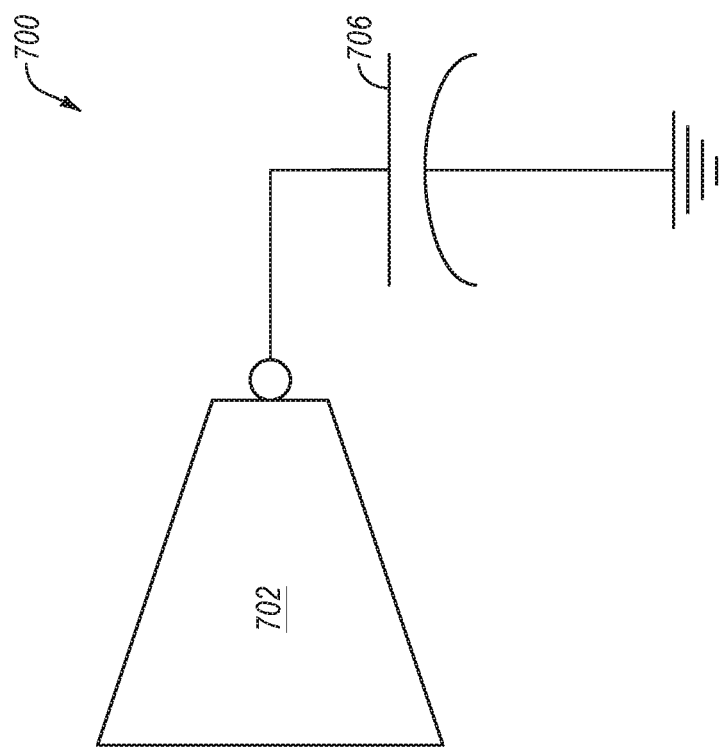
FIG. 7 illustrates an equivalent model of inverters within the oscillator.

FIG. 7 illustrates an equivalent model 700 of the inverters 374, 376, 378 of FIG. 3 and the inverters 574, 576, 578 of FIG. 5. The model 700 illustrates a gm stage 702 with an output capacitance 706. The transconductance gm is proportional to the bias current $I_B$, and the frequency of the oscillator is proportional to the ratio of gm/C. Therefore, any transient behavior in the bias currents is directly proportional to the oscillation frequency.

Figure 8:
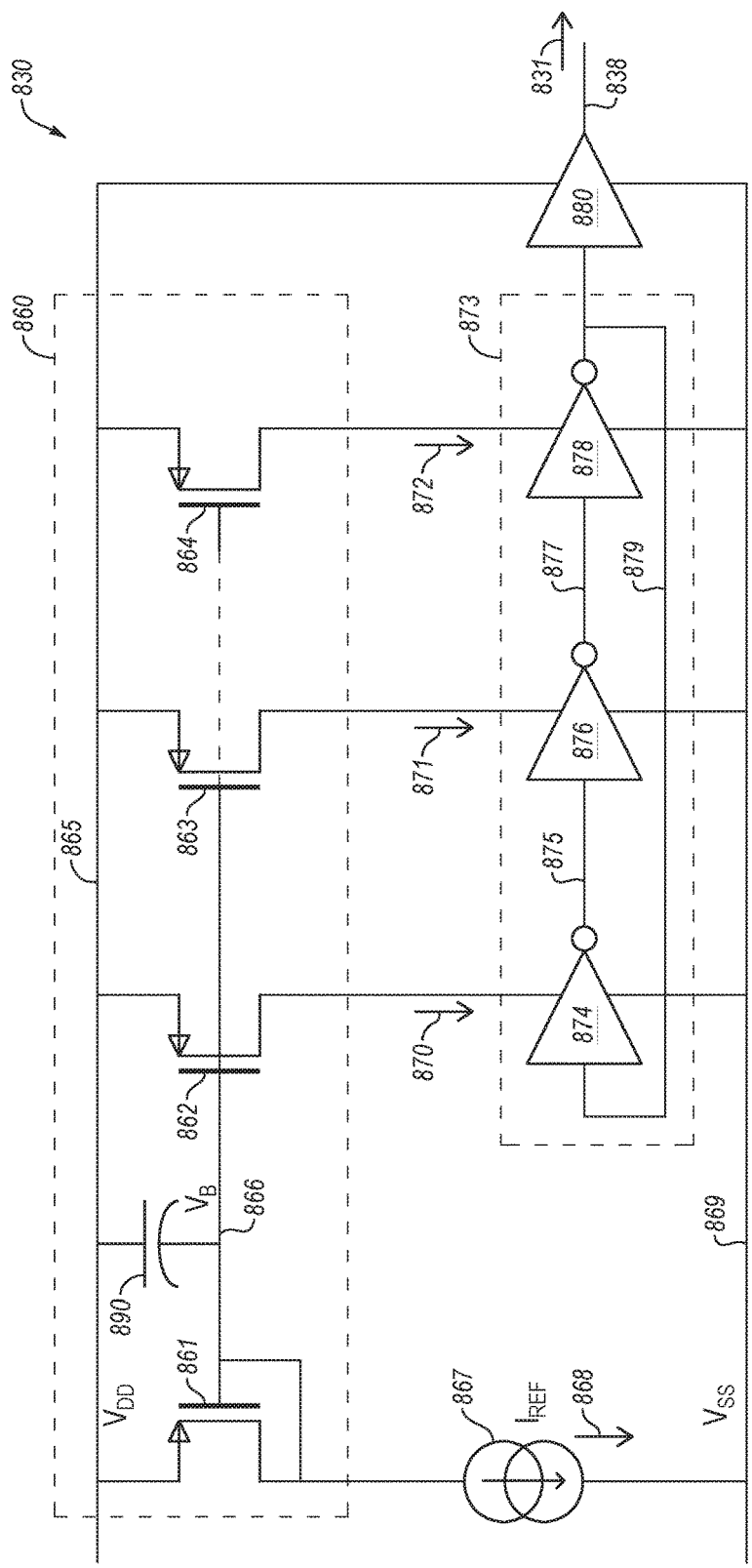
FIG. 8 illustrates a circuit diagram of an oscillator, in accordance with yet another embodiment described herein.

FIG. 8 illustrates an oscillator 830 configured as a current controlled oscillator, in accordance with another embodiment. The oscillator 830 provides control for the generation of the bias current to the ring oscillator. Such control of the bias current results in a reduction of overshoot of the bias current which results in a reduction of the overshoot in the output voltage $V_{OUT}$ of the charge pump during start-up of the system.

The oscillator 830 may be similar to oscillator 130 of FIG. 1 and oscillator 530 of FIG. 5. The oscillator 830 may include a current mirror 860 including a transistor 861 and one or more additional transistors 862, 863, 864 with respective sources coupled to a common source line 865 for providing a source voltage $V_{DD}$, and respective gates coupled to a common control line 866 which is further coupled to the drain of transistor 861.

The oscillator 830 further includes a constant current source 867 configured to source a reference current $I_{REF}$ 868 to a common reference line 869, which when operational exhibits a reference voltage of $V_{SS}$. Because of the current mirror configuration, each of the transistors 862, 863, 864 are configured to source respective bias currents 870, 871, 872 proportional to the reference current $I_{REF}$ 868 according to the proportional sizes of respective transistors 862, 863, 864. The common control line 866 responds to a bias voltage $V_B$ which in turn causes the respective transistors 862, 863, 864 to be respectively driven in order to generate the bias currents 870, 871, 872 for each of inverters 874, 876, 878.

The oscillator 830 further includes a ring oscillator 873 configured to include an odd number quantity of inverters, illustrated herein as inverters 874, 876, 878. In operation the inverter 874 receives bias current 870 from transistor 862 and also couples to common reference line 869. The inverter 874 further includes an output coupled to an input of inverter 876 via line 875. The inverter 876 receives bias current 871 from transistor 863 and also couples to common reference line 869. The inverter 876 further includes an output coupled to an input of inverter 878 via line 877. The inverter 878 receives bias current 872 from transistor 864 and also couples to common reference line 869. The inverter 878 further includes an output coupled to an input of inverter 874 via line 879. The oscillator 830 further includes an output buffer 880 coupled between line 879 and oscillator output 838 for passing the oscillator signal 831.

In accordance with the various embodiments and in response to the foregoing shortcomings, the oscillator 830 further includes a start-up oscillator bias control circuit 890 configured to control the generation of the bias current 870, 871, 872 to the ring oscillator 873 during start-up or power transient conditions. The start-up oscillator bias control circuit 890 is configured as a capacitor CS and provides low-pass filtering of the common control line 866 coupled to the gates of transistors 861, 862, 863, 864. The start-up oscillator bias control circuit 890 may couple between the common control line 866 and the common source line 865.

In operation, the start-up oscillator bias control circuit 890 reduces voltage spikes of the bias voltage $V_B$ at common control line 866 during power-up or other start-up or transient conditions. By reducing the voltage spikes or overshoots on the bias voltage $V_B$ at common control line 866, any current transients in the bias currents 870, 871, 872 are also reduced.

Figure 9:
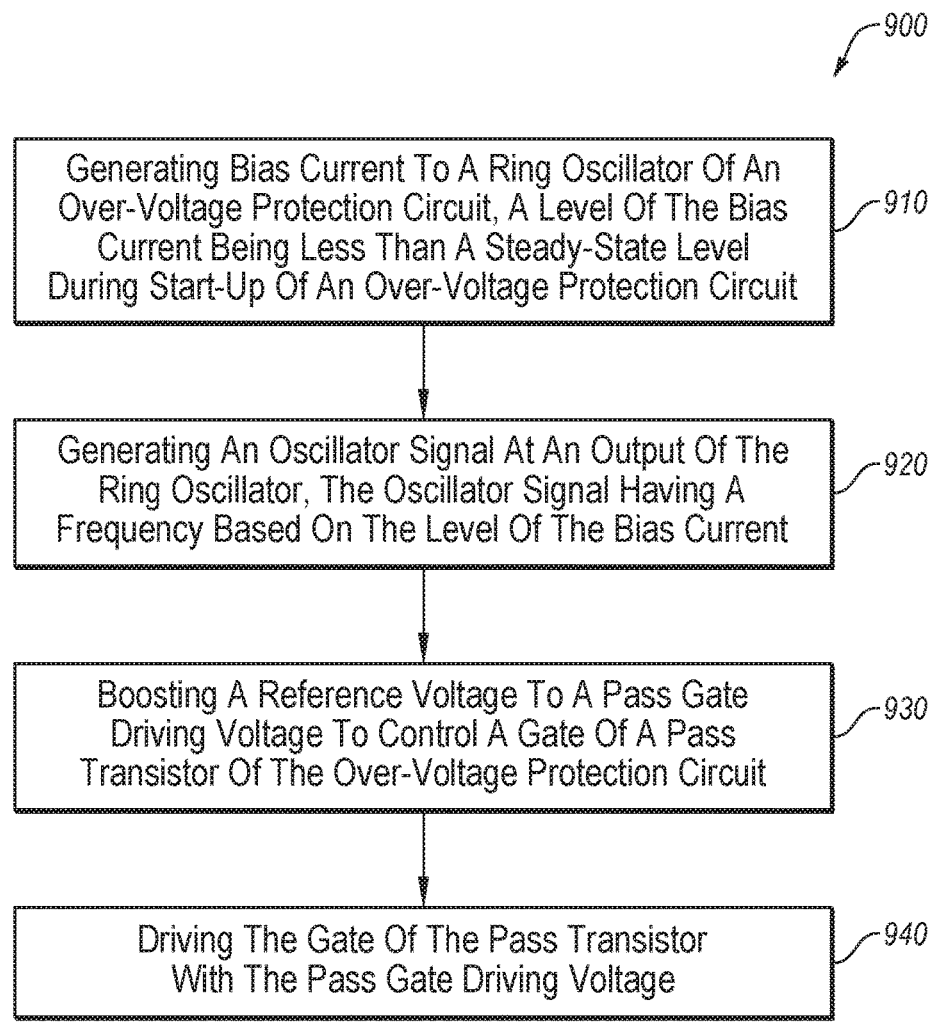
FIG. 9 illustrates a method for providing over-voltage protection for a circuit, in response to an input signal, in accordance with embodiments described herein.

FIG. 9 illustrates a method for providing over-voltage protection for a circuit, in response to an input signal. A method 900 may be performed using one or more of the circuits described above.

A step 910 generates one or more bias currents 570-572, 870-872 to a ring oscillator in a respective oscillator 130, 530, 830 of an over-voltage protection circuit 107 of FIG. 1. The bias currents may be separately generated as illustrated in one of FIG. 5, and FIG. 8. The bias currents may be generated at levels that are less during a start-up phase and greater during a steady-state phase during operation of the over-voltage protection circuit 107.

A step 920 generates an oscillator signal 131, 531, 831 at an output 138, 538, 838 of the oscillator 130, 530, 830. The oscillator signal 131, 531, 831 may vary in frequency with the frequency based, at least in part on the level of the bias currents 570-572, 870-872 described above.

A step 930 boosts a reference voltage $V_{REF}$ 102, 202 to a pass gate driving voltage $V_{OUT}$ 139, 239. The pass gate driving voltage $V_{OUT}$ 139, 239 controls a gate 140a of a pass gate 140 that provides isolation between a sensitive electronic circuit 116 and an input signal 109 received at the PCB 105.

A step 940 drives the gate 140a of the pass transistor 140 using the pass gate driving voltage $V_{OUT}$ 139, 239. The pass gate driving voltage $V_{OUT}$ 139, 239 provides a controlled drive signal to the pass gate 140 during a start-up phase but does not overshoot the steady-state level which may cause damage to the over-voltage sensitive circuit 116 on the PCB 105.

Accordingly, one embodiment of a protection circuit has been described as comprising a pass gate including a drain configured to receive an input signal, a source configured to output the input signal, and a gate configured to control passing of the input signal between the drain and the source. The protection circuit further comprises a voltage boosting circuit including an output coupled to the gate of the pass gate. The voltage boosting circuit is configured to generate a pass gate driving voltage on the output with the voltage boosting circuit further configured to passively control the pass gate driving voltage to a level less than a steady-state voltage level during start-up of the protection circuit.

The voltage boosting circuit of the protection circuit may an oscillator, and a charge pump configured to generate the levels of the pass gate driving voltage in response to control by the oscillator. The oscillator may include a start-up oscillator bias control circuit configured to reduce a frequency of the oscillator during start-up of the protection circuit with the frequency reduced to frequencies less than a steady-state frequency to passively control the pass gate driving voltage. The oscillator may further include a start-up oscillator bias control circuit configured to reduce a bias current to the oscillator during start-up of the protection circuit with the bias current reduced to levels less than a steady-state level to passively control the pass gate driving voltage.

Further, the oscillator may include a ring oscillator, and a current mirror of a plurality of transistors configured to supply a bias current to the ring oscillator. Yet further, the start-up oscillator bias control circuit may be configured to reduce a frequency of the oscillator to a level less than a steady-state level during start-up of the protection circuit. Alternatively, the start-up oscillator bias control circuit may be configured to reduce the bias current to the ring oscillator during start-up of the protection circuit. Yet alternatively, the start-up oscillator bias control circuit may be configured to provide low-pass filtering of gates of the plurality of transistors in the current mirror.

Accordingly, another embodiment of an interconnection system has been described as comprising a first printed circuit board (PCB) node coupled to an external interface, a second PCB node coupled to an electronic circuit, and an over-voltage protection circuit coupled between the first PCB node and the second PCB node. The over-voltage protection circuit includes a pass gate and a voltage boosting circuit. The pass gate includes a drain configured to receive an input signal, a source configured to output the input signal, and a gate configured to control passing of the input signal between the drain and the source. The voltage boosting circuit includes an output coupled to the gate of the pass gate with the voltage boosting circuit configured to generate a pass gate driving voltage on the output. The voltage boosting circuit is further configured to passively control the pass gate driving voltage to a level less than a steady-state voltage level during start-up of the protection circuit.

The voltage boosting circuit may include an oscillator, and a charge pump configured to generate the levels of the pass gate driving voltage in response to control by the oscillator. Also, the oscillator may include a start-up oscillator bias control circuit configured to reduce a frequency of the oscillator during start-up of the protection circuit with the frequency reduced to frequencies less than a steady-state frequency to passively control the pass gate driving voltage.

Further, the oscillator may include a start-up oscillator bias control circuit configured to reduce a bias current to the oscillator during start-up of the protection circuit with the bias current reduced to levels less than a steady-state level to passively control the pass gate driving voltage. Yet further, the oscillator may include a ring oscillator, and a current mirror of a plurality of transistors configured to supply a bias current to the ring oscillator. A start-up oscillator bias control circuit may be configured to reduce a frequency of the oscillator to a level less than a steady-state level during start-up of the over-voltage protection circuit, to reduce the bias current to the ring oscillator during start-up of the over-voltage protection circuit, or to provide low-pass filtering of gates of the plurality of transistors in the current mirror.

Accordingly, yet another embodiment including a method has been described as including the steps of generating bias current to a ring oscillator of an over-voltage protection circuit where a level of the bias current is less than a steady-state level during start-up of an over-voltage protection circuit. The method further includes generating an oscillator signal at an output of the ring oscillator where the oscillator signal has a frequency based on the level of the bias current. The method yet further includes boosting a reference voltage to a pass gate driving voltage to control a gate of a pass transistor of the over-voltage protection circuit. Finally, the method includes driving the gate of the pass transistor with the pass gate driving voltage.

The generating of the bias current may include passively reducing a bias current to a ring oscillator of an over-voltage protection circuit during start-up of the ring oscillator, and increasing the bias current to the ring oscillator during steady-state of the ring oscillator. The passively reducing a bias current may include low-pass filtering a supply voltage at gates of a current mirror outputting the bias current to the ring oscillator during start-up of the ring oscillator. Further, the low-pass filtering may include filtering with a capacitor coupled between the gates of the current mirror and a supply line providing the supply voltage.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A protection circuit, comprising:
a pass gate including a drain configured to receive an input signal, a source configured to output the input signal, and a gate configured to control passing of the input signal between the drain and the source; and
a voltage boosting circuit including an output coupled to the gate of the pass gate, the voltage boosting circuit configured to generate a pass gate driving voltage on the output, the voltage boosting circuit further configured to passively control the pass gate driving voltage to a level less than a steady-state voltage level during start-up of the protection circuit, wherein the voltage boosting circuit includes:
an oscillator; and
a charge pump configured to generate the levels of the pass gate driving voltage in response to control by the oscillator;
wherein the oscillator includes a start-up oscillator bias control circuit configured to reduce a frequency of the oscillator during start-up of the protection circuit, the frequency reduced to frequencies less than a steady-state frequency to passively control the pass gate driving voltage.

2. A protection circuit, comprising:
a pass gate including a drain configured to receive an input signal, a source configured to output the input signal, and a gate configured to control passing of the input signal between the drain and the source; and
a voltage boosting circuit including an output coupled to the gate of the pass gate, the voltage boosting circuit configured to generate a pass gate driving voltage on the output, the voltage boosting circuit further configured to passively control the pass gate driving voltage to a level less than a steady-state voltage level during start-up of the protection circuit, wherein the voltage boosting circuit includes:
an oscillator; and
a charge pump configured to generate the levels of the pass gate driving voltage in response to control by the oscillator;
wherein the oscillator includes a start-up oscillator bias control circuit configured to reduce a bias current to the oscillator during start-up of the protection circuit, the bias current reduced to levels less than a steady-state level to passively control the pass gate driving voltage.

3. A protection circuit, comprising:
a pass gate including a drain configured to receive an input signal, a source configured to output the input signal, and a gate configured to control passing of the input signal between the drain and the source; and
a voltage boosting circuit including an output coupled to the gate of the pass gate, the voltage boosting circuit configured to generate a pass gate driving voltage on the output, the voltage boosting circuit further configured to passively control the pass gate driving voltage to a level less than a steady-state voltage level during start-up of the protection circuit, wherein the voltage boosting circuit includes:
an oscillator; and
a charge pump configured to generate the levels of the pass gate driving voltage in response to control by the oscillator;
wherein the oscillator includes:
a ring oscillator; and
a current mirror of a plurality of transistors configured to supply a bias current to the ring oscillator;
wherein the protection circuit includes a start-up oscillator bias control circuit configured to provide low-pass filtering of gates of the plurality of transistors in the current mirror.

4. The protection circuit of claim 3, further including a start-up oscillator bias control circuit configured to reduce a frequency of the oscillator to a level less than a steady-state level during start-up of the protection circuit.

5. The protection circuit of claim 3, further including a start-up oscillator bias control circuit configured to reduce the bias current to the ring oscillator during start-up of the protection circuit.

6. An interconnection system, comprising:
a first printed circuit board (PCB) node coupled to an external interface;
a second PCB node coupled to an electronic circuit; and
an over-voltage protection circuit coupled between the first PCB node and the second PCB node, the over-voltage protection circuit including:
a pass gate including a drain configured to receive an input signal, a source configured to output the input signal, and a gate configured to control passing of the input signal between the drain and the source; and
a voltage boosting circuit including an output coupled to the gate of the pass gate, the voltage boosting circuit configured to generate a pass gate driving voltage on the output, the voltage boosting circuit further configured to passively control the pass gate driving voltage to a level less than a steady-state voltage level during start-up of the protection circuit, wherein the voltage boosting circuit includes:
an oscillator; and
a charge pump configured to generate the levels of the pass gate driving voltage in response to control by the oscillator:
wherein the oscillator includes a start-up oscillator bias control circuit configured to reduce a frequency of the oscillator during start-up of the protection circuit, the frequency reduced to frequencies less than a steady-state frequency to passively control the pass gate driving voltage.

7. The interconnection system of claim 6, wherein the start-up oscillator bias control circuit is configured to reduce a bias current to the oscillator during start-up of the protection circuit, the bias current reduced to levels less than a steady-state level to passively control the pass gate driving voltage.

8. The interconnection system of claim 6, wherein the oscillator includes:
a ring oscillator; and
a current mirror of a plurality of transistors configured to supply a bias current to the ring oscillator.

9. The interconnection system of claim 8, further including a start-up oscillator bias control circuit configured to reduce a frequency of the oscillator to a level less than a steady-state level during start-up of the over-voltage protection circuit.

10. The interconnection system of claim 8, further including a start-up oscillator bias control circuit configured to reduce the bias current to the ring oscillator during start-up of the over-voltage protection circuit.

11. The interconnection system of claim 8, further including a start-up oscillator bias control circuit configured to provide low-pass filtering of gates of the plurality of transistors in the current mirror.

12. A method, comprising:
generating bias current to a ring oscillator of an over-voltage protection circuit, a level of the bias current being less than a steady-state level during start-up of an over-voltage protection circuit;
generating an oscillator signal at an output of the ring oscillator, the oscillator signal having a frequency based on the level of the bias current;
boosting a reference voltage to a pass gate driving voltage to control a gate of a pass transistor of the over-voltage protection circuit; and
driving the gate of the pass transistor with the pass gate driving voltage.

13. The method of claim 12, wherein the generating the bias current includes:
passively reducing a bias current to a ring oscillator of an over-voltage protection circuit during start-up of the ring oscillator; and
increasing the bias current to the ring oscillator during steady-state of the ring oscillator.

14. The method of claim 13, wherein the passively reducing a bias current includes:
low-pass filtering a supply voltage at gates of a current mirror outputting the bias current to the ring oscillator during start-up of the ring oscillator.

15. The method of claim 14, wherein the low-pass filtering includes filtering with a capacitor coupled between the gates of the current mirror and a supply line providing the supply voltage.

* * * * *